United States Patent
Raichle et al.

(10) Patent No.: US 7,538,571 B2
(45) Date of Patent: May 26, 2009

(54) STARTER ZERO CURRENT TEST APPARATUS AND METHOD

(75) Inventors: Kurt Raichle, Owatonna, MN (US); Scott Krampitz, Blooming Prairie, MN (US); Weixing Xia, Portage, MI (US)

(73) Assignee: SPX Corporation, Charlotte, NC (US)

( * ) Notice: Subject to any disclaimer, the term of this patent is extended or adjusted under 35 U.S.C. 154(b) by 114 days.

(21) Appl. No.: 11/320,662

(22) Filed: Dec. 30, 2005

(65) Prior Publication Data

US 2007/0152702 A1 Jul. 5, 2007

Related U.S. Application Data

(63) Continuation of application No. 11/260,184, filed on Oct. 28, 2005, now Pat. No. 7,212,911.

(60) Provisional application No. 60/622,799, filed on Oct. 29, 2004.

(51) Int. Cl.
*G01R 31/34* (2006.01)
(52) U.S. Cl. ...................................................... 324/772
(58) Field of Classification Search ................ 324/772, 324/765, 763, 158.1, 426, 429; 701/114, 701/115, 29; 73/118.1; 318/490, 426, 429
See application file for complete search history.

(56) References Cited

U.S. PATENT DOCUMENTS

| | | | |
|---|---|---|---|
| 3,745,456 A | 7/1973 | Kahler | 324/73 |
| 3,893,029 A * | 7/1975 | Vensel et al. | 324/772 |
| 3,903,737 A | 9/1975 | Burden et al. | 73/118 |
| 3,936,744 A | 2/1976 | Perlmutter | 324/158 |
| 4,070,624 A | 1/1978 | Taylor | 324/158 |
| 4,500,304 A | 2/1985 | Foster | 474/138 |
| 4,666,122 A | 5/1987 | Goodard | 248/666 |
| 4,781,665 A | 11/1988 | Walker | 474/133 |
| 4,832,666 A | 5/1989 | Henderson | 474/135 |
| 4,849,665 A | 7/1989 | Kitamura et al. | 310/68 |
| 4,945,272 A | 7/1990 | Ochi et al. | 310/91 |
| 4,980,589 A | 12/1990 | Ochi et al. | 310/68 |
| 5,040,493 A | 8/1991 | Gajewski et al. | 123/41.31 |
| 5,125,376 A | 6/1992 | Williams et al. | 123/195 |
| 5,156,573 A | 10/1992 | Bytzek et al. | 474/74 |
| 5,195,366 A | 3/1993 | Duncan | 73/118.1 |
| 5,473,208 A | 12/1995 | Stihi | 310/68 |
| 5,541,840 A | 7/1996 | Gurne et al. | 364/424.03 |
| 5,550,485 A | 8/1996 | Falk | 324/772 |
| 5,689,517 A | 11/1997 | Ruparel | 371/22.3 |
| 5,705,870 A | 1/1998 | Thomsen et al. | 310/91 |
| 5,718,196 A | 2/1998 | Uchiyama et al. | 123/195 |
| 5,938,169 A | 8/1999 | Ogawa et al. | 248/674 |
| 6,009,363 A | 12/1999 | Beckert et al. | 701/33 |
| 6,026,461 A | 2/2000 | Baxter et al. | 710/244 |
| 6,147,426 A | 11/2000 | Lepi et al. | 310/91 |
| 6,175,789 B1 | 1/2001 | Beckert et al. | 701/33 |
| 6,181,992 B1 | 1/2001 | Gurne et al. | 701/29 |

(Continued)

*Primary Examiner*—Ha Tran Nguyen
*Assistant Examiner*—Tung X Nguyen
(74) *Attorney, Agent, or Firm*—Baker & Hostetler LLP

(57) ABSTRACT

An alternator and starter tester system having a starter current zero test. The current is measured before and after a solenoid of a starter motor is energized and deenergized to determine if the starter motor should be failed. This allows the operator to quickly determine if the starter motor is stuck on during normal starter motor testing.

15 Claims, 8 Drawing Sheets

U.S. PATENT DOCUMENTS

| | | | |
|---|---|---|---|
| 6,226,305 B1 | 5/2001 | McLoughlin et al. | 370/532 |
| 6,276,194 B1 | 8/2001 | Vinton et al. | 73/40.7 |
| 6,292,931 B1 | 9/2001 | Dupenloup | 716/18 |
| 6,304,012 B1 | 10/2001 | Chen et al. | 310/58 |
| 6,304,016 B1 | 10/2001 | Frederick et al. | 310/91 |
| 6,394,250 B1 | 5/2002 | Ouchi | 192/45 |
| 6,480,723 B1 | 11/2002 | Davidson et al. | 455/557 |
| 6,553,039 B1 | 4/2003 | Huber et al. | 370/466 |
| 6,634,896 B1 | 10/2003 | Potega | 439/218 |
| 6,647,027 B1 | 11/2003 | Gasparik et al. | 370/519 |
| 6,674,046 B2 | 1/2004 | Bankstahl et al. | 219/133 |
| 6,687,263 B2 | 2/2004 | van Oldenborgh et al. | 370/476 |
| 6,704,829 B1 | 3/2004 | Hoshi et al. | 710/305 |
| 6,738,696 B2 | 5/2004 | Oi | 701/29 |
| 6,777,945 B2 | 8/2004 | Roberts et al. | 324/426 |
| 6,791,332 B2 | 9/2004 | Raichle | 324/429 |
| 6,834,631 B1 | 12/2004 | Blackburn et al. | 123/179.3 |
| 6,895,809 B2 * | 5/2005 | Raichle | 73/119 R |
| 6,986,292 B2 | 1/2006 | Kemnade | 73/862.191 |
| 2004/0118194 A1 | 6/2004 | Raichle | 73/118.1 |
| 2004/0163501 A1 | 8/2004 | Chen | 81/177.1 |
| 2005/0035752 A1 | 2/2005 | Bertness et al. | 324/120 |
| 2006/0119365 A1 | 6/2006 | Makhija | 324/380 |

* cited by examiner

STARTER ZERO CURRENT TEST APPARATUS AND METHOD

CROSS-REFERENCE TO RELATED APPLICATIONS

This application is a continuation of and claims priority to U.S. patent application Ser. No. 11/260,184, entitled "ALTERNATOR AND STARTER TESTER APPARATUS AND METHOD," filed Oct. 28, 2005, now U.S. Pat. No. 7,212,911 which claims priority from U.S. Provisional Application No. 60/622,799, entitled "ALTERNATOR AND STARTER TESTER APPARATUS AND METHOD," filed Oct. 29, 2004, both of which are hereby incorporated by reference in their entirety.

FIELD OF THE INVENTION

The present invention pertains to the field of testing vehicle motor rotary accessory devices. More particularly, the invention relates to devices for testing alternators and/or starter motors.

BACKGROUND OF THE INVENTION

It is well known in the vehicle industry that certain rotary accessory devices are often used in connection with vehicle motors. Two such well known accessory devices are alternators and starter motors. Alternators are used in connection with an engine and are belt driven by the engine. Alternators have internal components, which when rotated supply electrical power to a vehicle and/or an engine. Alternators are typically removably but rigidly mounted via a bracket to the engine block or the chassis of the vehicle. In many cases, where a standard type of alternating mounting arrangement is used, the alternator has "ears" with holes that are mounted onto a post or belt attached to the vehicle. This permits pivoting of the alternator so that the alternator can be pivoted around the post against the belt tension in order to install and remove belts, and provide a suitable tension when the belt is installed.

Starter motors are electrical motors, which are typically removably but rigidly mounted to an engine or transmission casing. The starter motor has an electrically driven pinion gear extending from the starter motor that engages a component (typically gears on the flywheel of the engine) in order to be able to attachment mechanisms for attaching said starter motor.

It is often desirable to test alternators and/or starter motors at locations where they have been removed from the vehicle, e.g., on a test bench. For example, such testing may be desirable before installing a new alternator or new starter or may be desirable for removing an existing alternator or starter for testing.

When testing an alternator, it is desirable to attach a belt to a pulley of the alternator and drive the alternator belt with a motor. This situation requires both: (1) a way to securely but removably mount the alternator, and (2) a way to provide belt tensioning. It would be desirable to have an apparatus and method that is able to conveniently mount the alternator to the overall testing apparatus so that it can be quickly, conveniently, safely, and easily installed and/or removed with respect to the testing apparatus. It would also be desirable to have an apparatus and method that can quickly, conveniently, safely and easily provide tension to the belt that is used to drive the alternator via a motor associated with the testing apparatus.

When testing a starter motor, the starter motor is typically connected to a device that provides power in order to selectively operate the starter motor. In such a situation, it is desirable to be able to hold the starter motor in place in a conventional location during testing. Thus, it would be desirable to have a method and apparatus that can quickly, conveniently, safely and easily provide a mount for the starter motor in a testing apparatus.

Testing of starter motor can be time consuming if during the test, the starter motor becomes stuck. If the starter motor is stuck, it can lead to inaccurate results. Thus, it is desirable to have an apparatus and method of quickly test the starter motor and determine if it is stuck on.

Furthermore, conventional alternator and starter testers have been fairly complex in operation with limited safety features. This had been acceptable in the past due to the fact that most parts retailers employed skilled counter people and kept the test equipment behind the counters, away from the customers. As retailers have evolved into more of a merchandising customer-orientated retail environment, they have moved the test equipment to the front of the store so customers can interact with store personnel to test these components. The test is considered a service for the customers and efforts were needed to make the results easy to understand for the customer and provide a solution to the customer's problem. The skill level of the counter person has declined as well due to increased personnel turn over. This resulted in a need for a simplified, yet accurate system to be used.

Retailers and component rebuilders are faced with a high percentage of the components that are returned for warranty work, even though the components are actually working properly. This warranty problem can cost the industry millions of dollars each year. Thus, a need exists for an accurate and easy to use alternator and starter tester apparatus and method in order to accurately diagnose the problem.

New alternators are becoming more complex to test. In the past, alternators were very simple in the manner in which they were energized and regulated. As technology has evolved, the manner in which alternators are regulated has become more complex and diversified from manufacturer to manufacturer. Traditional test equipment has handled this technological evolution with complex and expensive methods.

SUMMARY OF THE INVENTION

The foregoing needs are met, to a great extent, by the present invention, wherein in one aspect, an apparatus is provided that in some embodiments an alternator and/or starter motor tester include a starter zero current test.

In accordance with one embodiment of the present invention, an alternator and starter tester for testing a starter motor is provided and can include a software that can control a starter zero test, a first switch that when closed, can allow power to a transformer, a second switch that when closed, can allow power to a solenoid of the starter motor, a current meter than can measure current flowing on a power line, and a processor that can communicate with the software, the first switch, the second switch, the transformer, the solenoid and the current meter.

In accordance with another embodiment of the present invention, a method of testing a starter motor can include closing a first switch so that current can flow to a transformer which can supply current to the starter motor, measuring current with a current meter before a solenoid of the starter motor is energized, and failing the starter motor if current is detected above the predetermined level.

In accordance with yet another embodiment of the present invention, an alternator and starter tester system for testing a starter motor can include a software means that can control a starter zero test, a first switch means that when closed, can allow power to a power transforming means, a second switch that when closed, can allow power to a solenoid means of the starter motor, a current measuring means that can measure current flowing on a power line, and a processing means that can communicate with the software means, the first switch means, the second switch means, the power transforming means, the solenoid means and the current measuring means.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION

Figure 1:
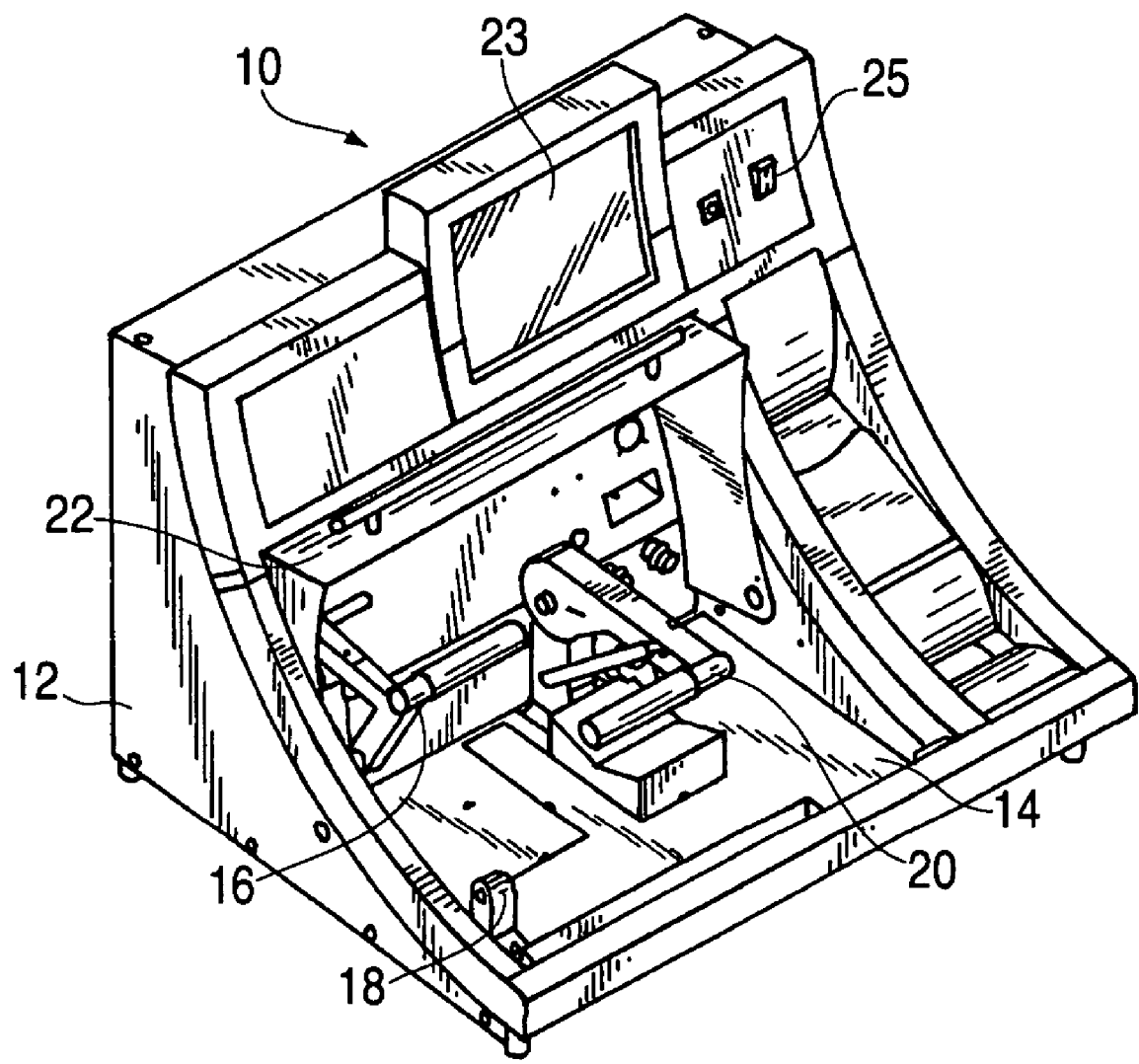
FIG. 1 is a perspective view of an alternator and starter motor tester apparatus according to an embodiment of the present invention.

The invention will now be described with reference to the drawing figures, in which like reference numerals refer to like parts throughout. An embodiment in accordance with the present invention provides an alternator and starter tester apparatus for holding and testing an alternator and/or starter motor that includes a protective hood or cover, a controller connecting an LCD touch-screen, a multiplexer, an alternator main harness connector, a starter harness self-test connector, a barcode connector, USB host and USB function connectors, an Ethernet connector, and a compact flash connector. Additionally, a starter zero current test and apparatus are included in the present invention.

An embodiment of the present testing apparatus is illustrated in FIG. 1. FIG. 1 illustrates an alternator and/or starter testing device 10 ("tester") including a housing 12 and a base plate (or chassis) 14. The housing 12 surrounds and supports various operative components of the alternator and/or starter testing device 10 including, for example, a power supply, diagnostic electronics, mounting devices, a display, a closable front cover, and the like. In one embodiment, a monitor screen 23, such as an LCD touch-screen may be implemented within the housing 12 design. A test power button 25, such as a toggle-switch design, is provided on the housing 12 to turn the tests on and off. A main power switch (not shown) is also used to provide main power to the alternator and/or starter testing device 10.

The alternator and/or starter testing device 10 also includes an alternator belt tensioning arrangement generally designated 16, an alternator mounting arrangement generally designated 18, and a starter holder arrangement generally designated as 20. Each of the belt tensioning arrangement 16, the alternator mounting arrangement 18, and the starter motor holder arrangement 20 can be mounted directly to the base plate 14.

The alternator belt tensioning arrangement 16 and the mounting arrangement 18 together can hold the alternator in place for testing. An installation assembly that includes one or more mounting pins (not shown) can be placed in the mounting arrangement 18 in order to mount the alternator. The alternator can be horizontally or vertically mounted depending on the type of alternator. The pins are replaceable to allow flexibility for current and future applications.

A test adapter and power leads can be connected to the alternator in order to provide test information to the alternator and/or starter testing device 10. Additionally, a drive belt, such as a serpentine or V belt and the like, can be connected to the alternator and the motor of the alternator and/or starter testing device 10 to simulate the alternator operating environment in the vehicle. A gas piston may be used for belt tension to ensure consistent belt tension during testing and thereby eliminating over tensioning or slipping belts that may affect test results.

The starter motor holder arrangement 20 includes a quick release ratchet system, wherein the starter is placed on a pad and held in place by the ratchet system. The starter motor holder arrangement 20 includes, a support pad, a handle and a release lock that when operated engages and disengages a lock (pawl, for example) from the ratchet. The starter motor holder arrangement 20 eliminates straps, uses quick ratchet to hold starter without the need of any additional holding mechanism or user assistance during the test. Thus, this speeds loading and unloading of components to be tested. The starter is placed on the pad and the operator squeezes the release lock and presses down on the handle to engage the starter and then releases the lock so that the lock is again reengaged. Leads, including, for example, battery lead, ground lead, solenoid lead and sense lead are connected to the starter in order to conduct the tests.

FIG. 1 also illustrates the monitor screen 23 that can operate as a touch-screen LCD user interface that communicates with a controller (discussed below) as well as to display information to the user. The invention also utilizes an on-line tutorial for quickly training new personnel on the unit's functionality and on-line help screens to help new users navigate and test components during a test. The LCD touch-screen offers step-by-step instructions for setting up the tester and conducting tests. The tester 10 can also include on-screen hook up diagrams and a specification library database, which eliminate the need for paper flipcharts and enables software updates for new alternator applications or starter configurations. This database can be updated by compact flash, flash drive, other memory media or remotely via a network connection (discussed below). The monitor screen allows users to run advertising screens when the tester is not in use. These screens can be uploaded to the tester from a user's network server or uploaded from a compact flash or other memory media. Additionally, the screen is capable of displaying information in various updatable languages.

The alternator and/or starter testing device 10 outputs "Good/Bad" or "Pass/Fail" results to the user. A user printout that details test results and provides technical advice for other potential problems, if the component tested as good or pass, can be provided to the user.

Figure 2:
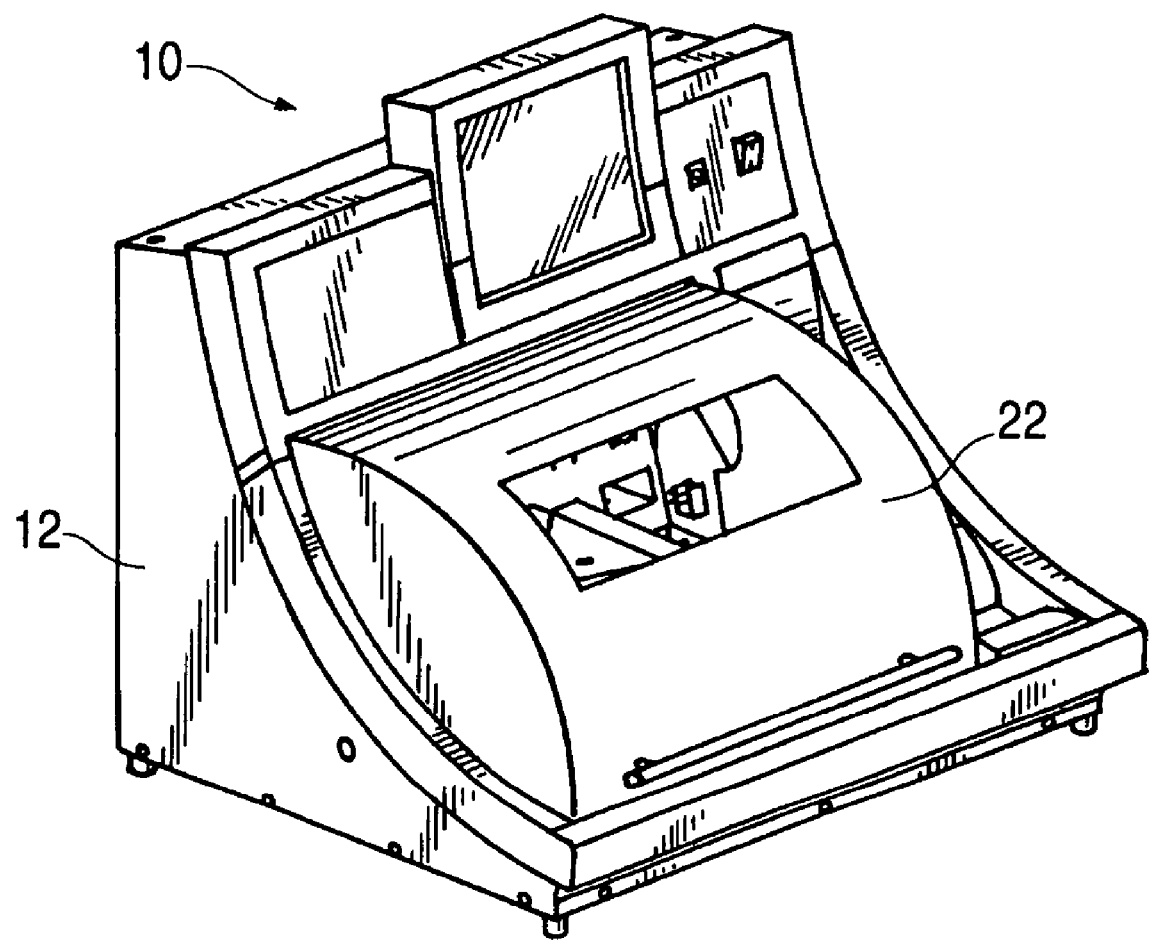
FIG. 2 is a perspective view of the alternator and starter testing apparatus of FIG. 1 depicting a protective door cover in a closed position.

FIG. 2 is a perspective view of the alternator and starter testing apparatus of FIG. 1 depicting a protective door cover in a closed position. In one embodiment, the alternator and/or start testing device 10 incorporates enhanced safety features, such as the protective door cover 22 to enclose moving parts during tests. The protective door cover 22 conceals the belt tensioning arrangement 16, the alternator mounting arrangement 18, the starter motor holder arrangement 20, and the test components, such as an alternator or starter motor from the operator. The protective door cover 22 of the alternator and/or starter testing device 10 is shown covering at least the belt tensioning arrangement 16, the alternator mounting arrangement 18, and the starter motor holder arrangement 20 in the closed position.

In the closed position, the protective door cover 22 eliminates the possibility of hands getting caught in moving parts or projectiles from being thrown towards customers or store personnel. In another embodiment, the protective door cover 22 has a door interlock switch (not shown) to disable tests while the protective door cover 22 is open. In still another embodiment, the protective cover includes a viewing window so that the operator can observe the testing components during the tests.

Figure 3:
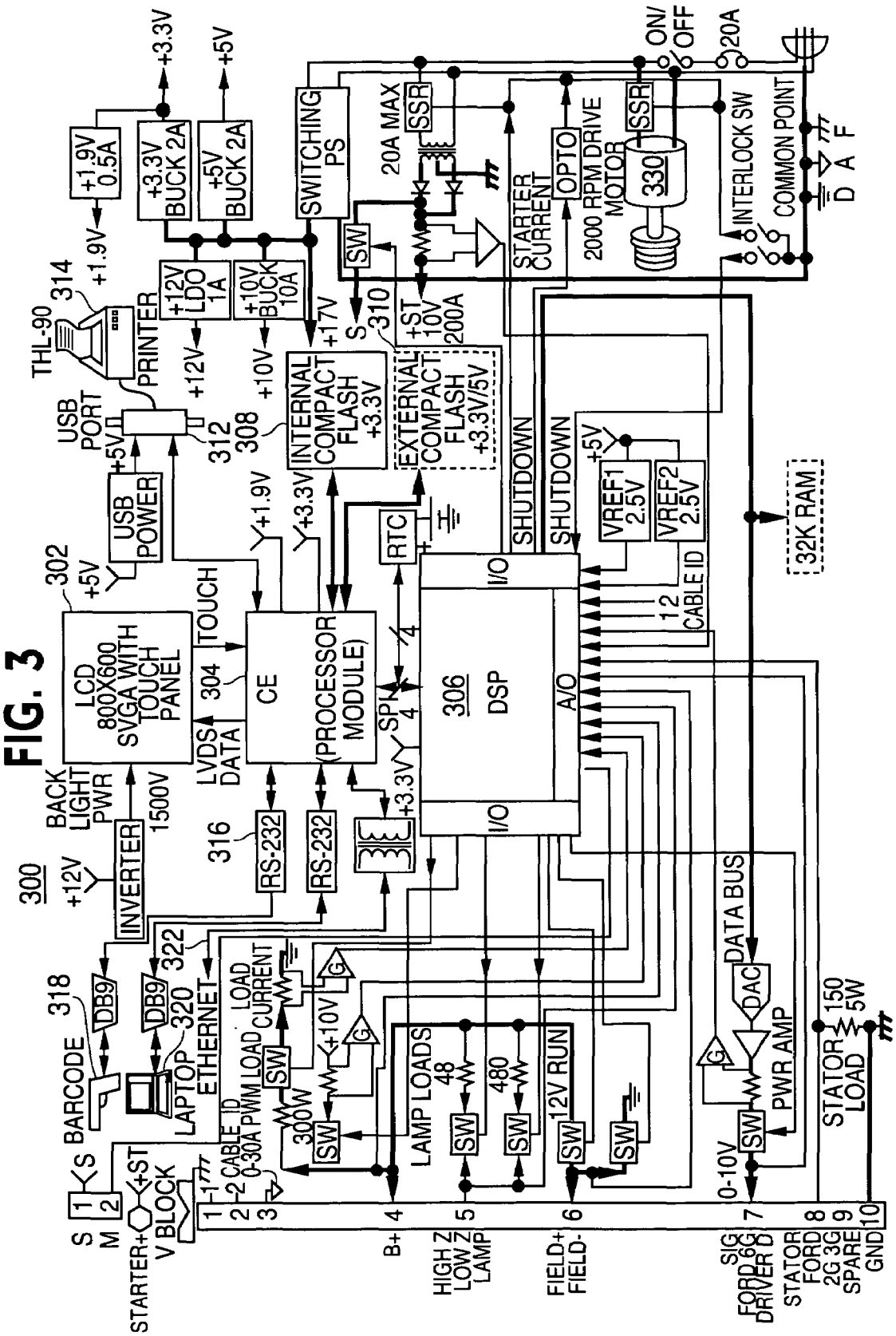
FIG. 3 is a block diagram of the main components of the alternator and starter testing apparatus of FIG. 1.

FIG. 3 is a block diagram 300 of the components of the alternator and/or starter testing device 10. The major components include an monitor screen (23), such as LCD screen 302 to display various information to the user. The LCD screen can also be a touch panel to input information as desired by the user and can be controlled by a processor 304. Another component is the processor 304, which can be any processor or controller, including a FPGA (Field Programmable Gate Array). The processor is capable of running various OS (Operating System) including Linux, Apple Computer's Operating System (such as OS X), Windows, Windows CE and the like. The processor 304 also communicates with a digital signal processor 306, which includes an A/D converter.

The processor can be configured to communicate with an internal 308 and external 310 memory. The memory can be any memory including, for example, compact flash, SD (secure digital), USB flash drives, and the like. A USB (universal serial bus) port 312 can communicate with the processor 304 and provides a connection for various USB devices, such as, for example a printer 314 or external memory drives. Additionally, RS-232 ports 316 can also communicate with other external devices, such as a computing device (laptop) 320 or a bar code reader 318. The computing device 320 can be any computing device, including a personal computer, a PDA (personal digital assistant), a cell phone and the like. The bar code reader 318 allows the user to scan from a bar code that may be attached to the test component various information, such as alternator/starter type, serial numbers, manufacturer and the like.

The processor 304 can also interact with a networked computer, LAN (local area network) or a distributed network, such as the Internet 322 and the like. This connection allows the user to update the tester and also send information regarding the test results to a remote location. The updated information can include, software, firmware, languages and database for the components to be tested or to the tester 10.

A motor 330 is also provided in order to test alternators. Motor 330 can simulate the engine of a vehicle and includes a pulley to mate with a belt. At one end, the belt is coupled to the motor 330's pulley and at the other end is coupled to the pulley of the alternator to be tested.

Figure 4:
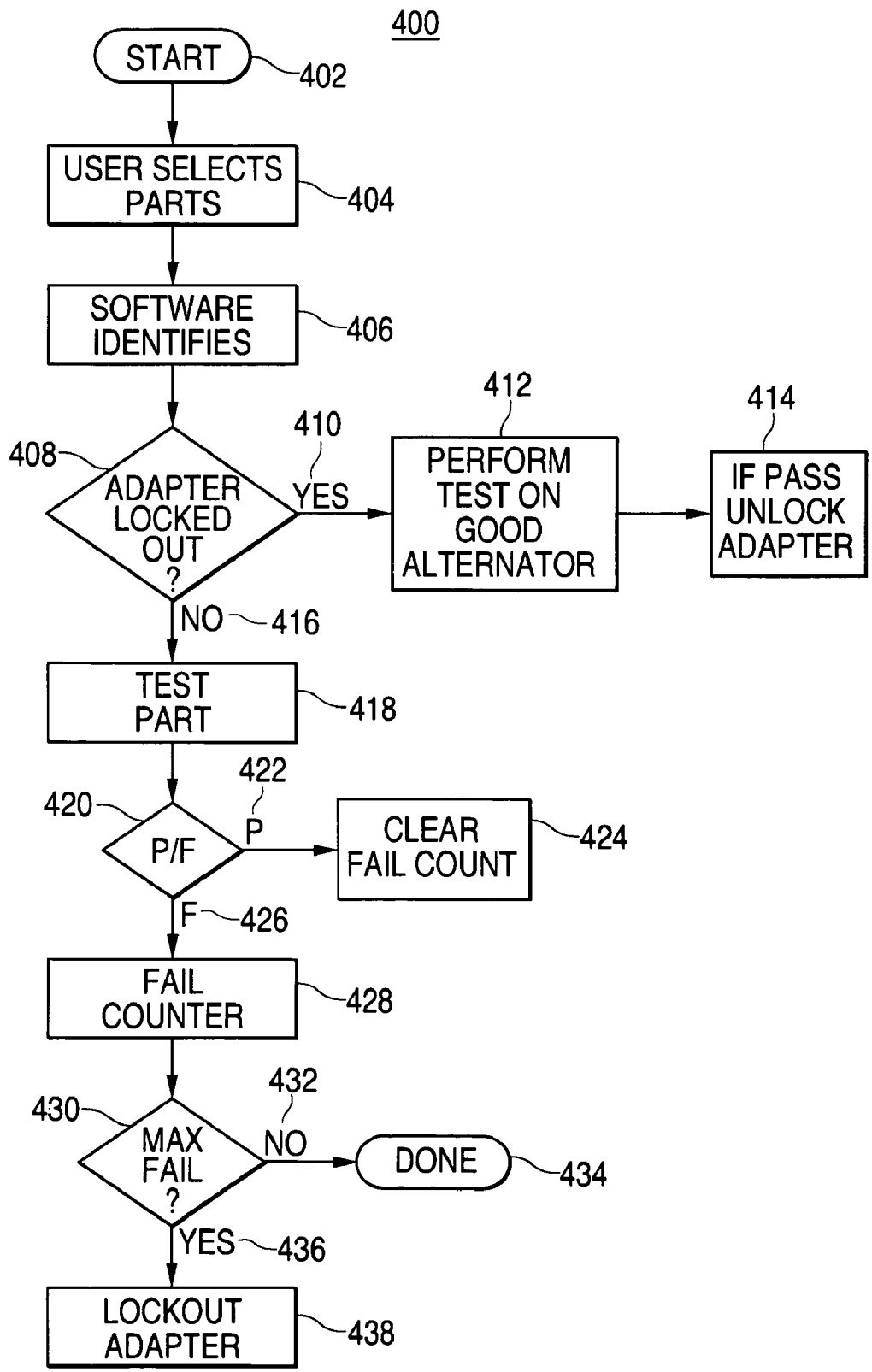
FIG. 4 illustrates an alternator cable check method of an embodiment of the present invention.

FIG. 4 illustrates an alternator cable check method 400 embodiment of the present invention. Currently there is no effective way of verifying that a test lead or connecter used to test an alternator is actually a good test lead. Because there are many different alternators with many different mechanical style electrical connectors, providing a conventional matting connector to conduct a loop-back test would not be a convenient or economical solution. To overcome this problem, a software is provided to keep track of the number of times in sequence the tester fails an alternator, which uses a specific connector. The software keeps track of how many times a specific connector has failed sequentially when used with that type of alternator. If a preset number of failures is met, then software will "lock out" that specific connector so that it can not be used in later testing. The operator can enable the "locked" connector by getting a known good alternator and re-running a test. If the test passes (i.e., the adapter is actually good), then the adapter can be re-enabled and be used in future tests.

Turning to FIG. 4, which illustrates method 400 that starts at step 402. The user selects the component or the part to test at step 404 through an input device, such as the LCD screen. At step, 406, the software identifies the cable connector to the user. In the case of an alternator, the alternator connector is identified for the user. At step 408, the software detects whether the alternator connector is "locked out." That is, the software will not allow the alternator to be tested with that connector. If yes 410, then the user is instructed via the LCD screen to perform a test with the connector on a good (known) alternator. If the connector passes, then the software "unlocks" the connector at step 414. When the connector is unlocked, it can again be used to test alternators. If the connector fails, then the connector remains "locked."

Turning back to step 408, if the connector is not locked 416, then the tester proceeds to test the component or part at step 418. At step 420, the software will note whether the alternator passes or fails. If pass 422, then clear any fail counts for this specific connector at step 424. If the alternator fails 426, then an increment counter is started for this specific connector at step 428. At step 430, the software determines whether or not the connector has failed for a certain number of times. The number of times can be determined by the user and can range, for example, from 1-5, from 1-7, and another ranges desired by the user. If the maximum limit has not 432 been reached, then the method end at step 434 until the next test. If the maximum limit has been reached 436, then the connector is locked out at step 438. When the adapter is locked out, it can be discarded or returned to the manufacturer. As stated above, the adapter can be "unlocked" if it passes another test using a good alternator. This method prevents the user from continue to use bad connectors that may provide inaccurate test results. Additionally, this method can also prevent good connectors from being discarded unless it fails a certain number of times.

Figure 5:
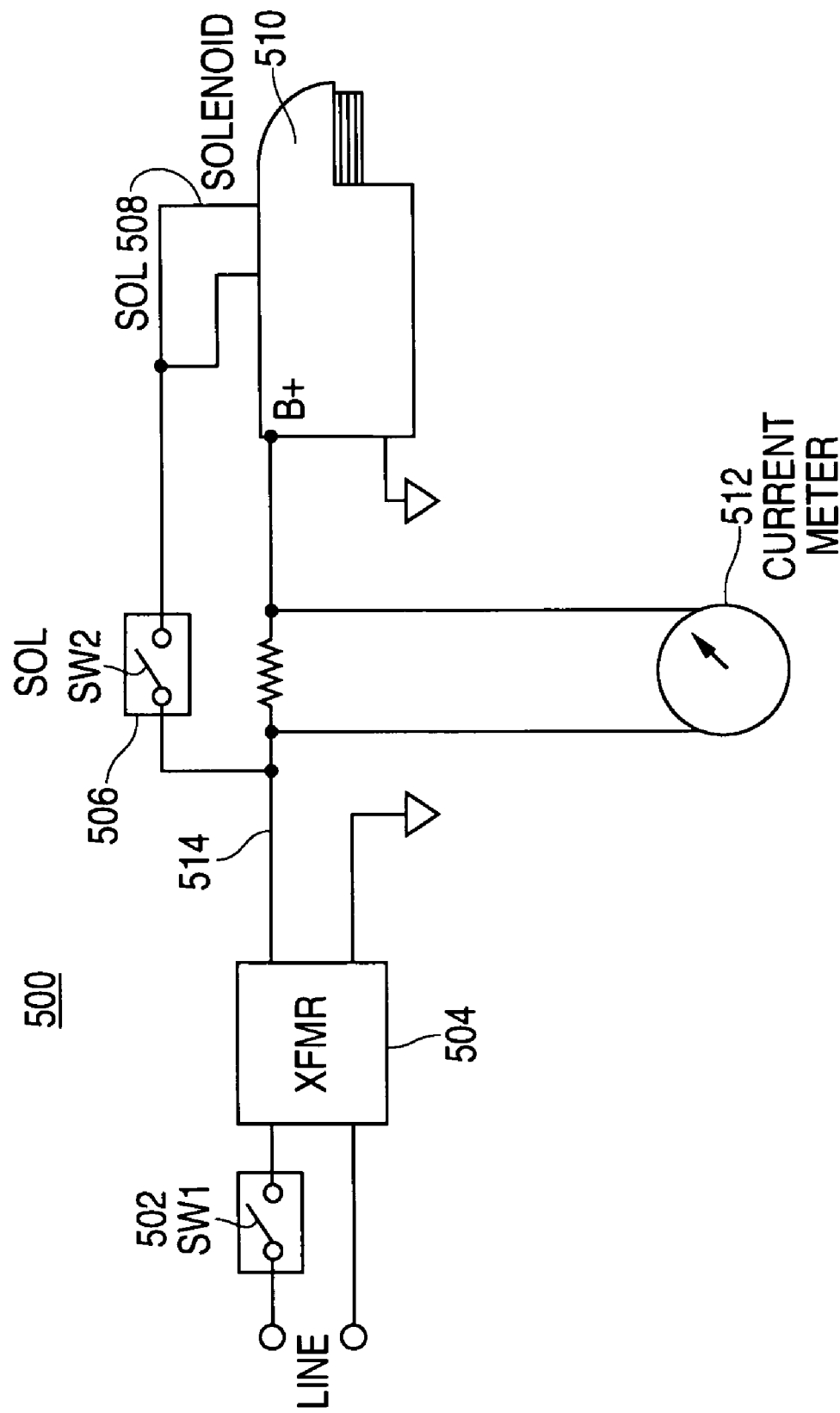
FIG. 5 illustrates the starter zero current components that are used in the zero current method.
Figure 6:
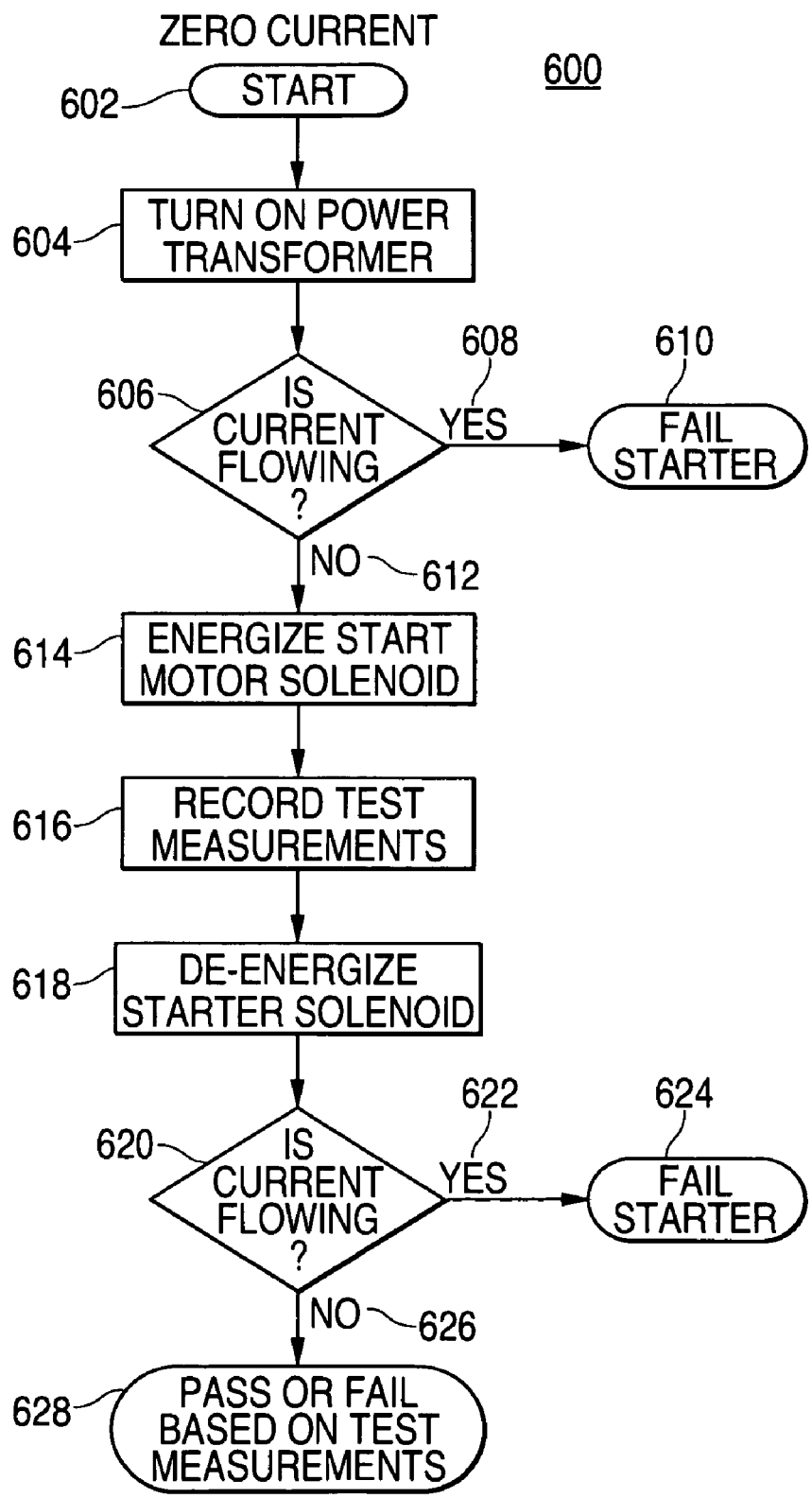
FIG. 6 illustrates the steps of the starter zero current test method.

Referring to FIGS. 5 and 6, in some embodiments, a starter zero current test is provided to determine if a starter motor's solenoid breaks power to the motor when the start signal is removed from the starter. A solenoid start signal is made switchable separate from the main battery power to the starter. The main battery power current is monitored for zero current before and after the solenoid is activated and deactivated, respectively. If current is detected in either case the starter is considered to be stuck on and thus fails the test.

FIG. 5 illustrates the starter zero current components 500 that may be used in the zero current method. A first switch 502, when closed, allows power to a transformer 504. A second switch 506, when closed, allows power to the solenoid 508 of a starter motor 510 for testing. A current meter 512 monitors the current in line 514.

FIG. 6 illustrates the steps that may be involved in the starter zero current test 600. At step 602, the method starts by having the user input information regarding the starter motor to be tested. The tester configures itself for the test that needs to be conducted including the starter zero method. At step 604, the software can direct the DSP or the processor to activate the first switch to allow power to the transformer. At step 606, the zero current check is conducted to determine if any current is flowing. If yes 608, then fail the starter. At this point, minimal current (5-10 amps) should be flowing and if the current exceeds a certain limit, such as about 40 amps, then the starter should be failed. If no 612, then at step 614, energize the starter motor's solenoid by activating the second switch. At step 616, record the test data and store the data into memory. At step 618, the solenoid is de-energized by deactivating the second switch and the transformer is also de-energized. Again, the current check is conducted at step 620 and if yes 622, then fail starter at step 624. If no 626, then proceed to step 628, wherein the starter motor can pass or fail depending on the measured data.

The present invention uses improved test leads to ensure accurate test results and increased lead life. The tester utilizes BERNDY connectors, which demonstrate an improved strain relief and have molded ends on high use cables. The tester apparatus has the ability to perform self calibration, which eliminates the need for external calibration, ensuring the repeatability and accuracy of tests conducted in the field. Furthermore, the tester apparatus can measure alternator diode ripple pattern accurately and catches faults with a rectifier bridge that could other wise go undetected.

The tester also includes internal signal generation, which can emulate the signal of vehicle computers based on alternator part number eliminating the need for expensive external adapters. This feature may be required for modern computer controlled vehicles that have the cars on board computer control or monitor charging output.

In some embodiment, the present invention comprises circuitry that enables programmable switching or multiplexing of the test circuit for connection to the desired pin in the connector on the alternator. This allows the use of one adapter cable for most if not all alternators with a specific connector regardless of the alternator connector pin location. This embodiment allows the tester to configure itself internally to adapt to connector configurations that have different wiring (pin-out) requirements for different test applications. Additionally, this embodiment eliminates the need for multiple adapter cables with different wiring pins, reduces the total number of cables required and eliminates confusion of the operator that occurs when selecting the correct cable for a particular component or test.

Alternators typically have up to six electrical connections, of which two are connections for positive and negative of the battery. The other four connections may be various voltage regulation functions. Multiple alternators use the exact same physical connector for these battery connections but change the location of a specific electrical circuit in the connector based on manufactures' discretion. This required the operator to use of various adapter cables (as many as 50 different types) based on various of physical configurations of various alternators in order to connect the correct test circuit to the correct pin in the connector.

Figure 7:
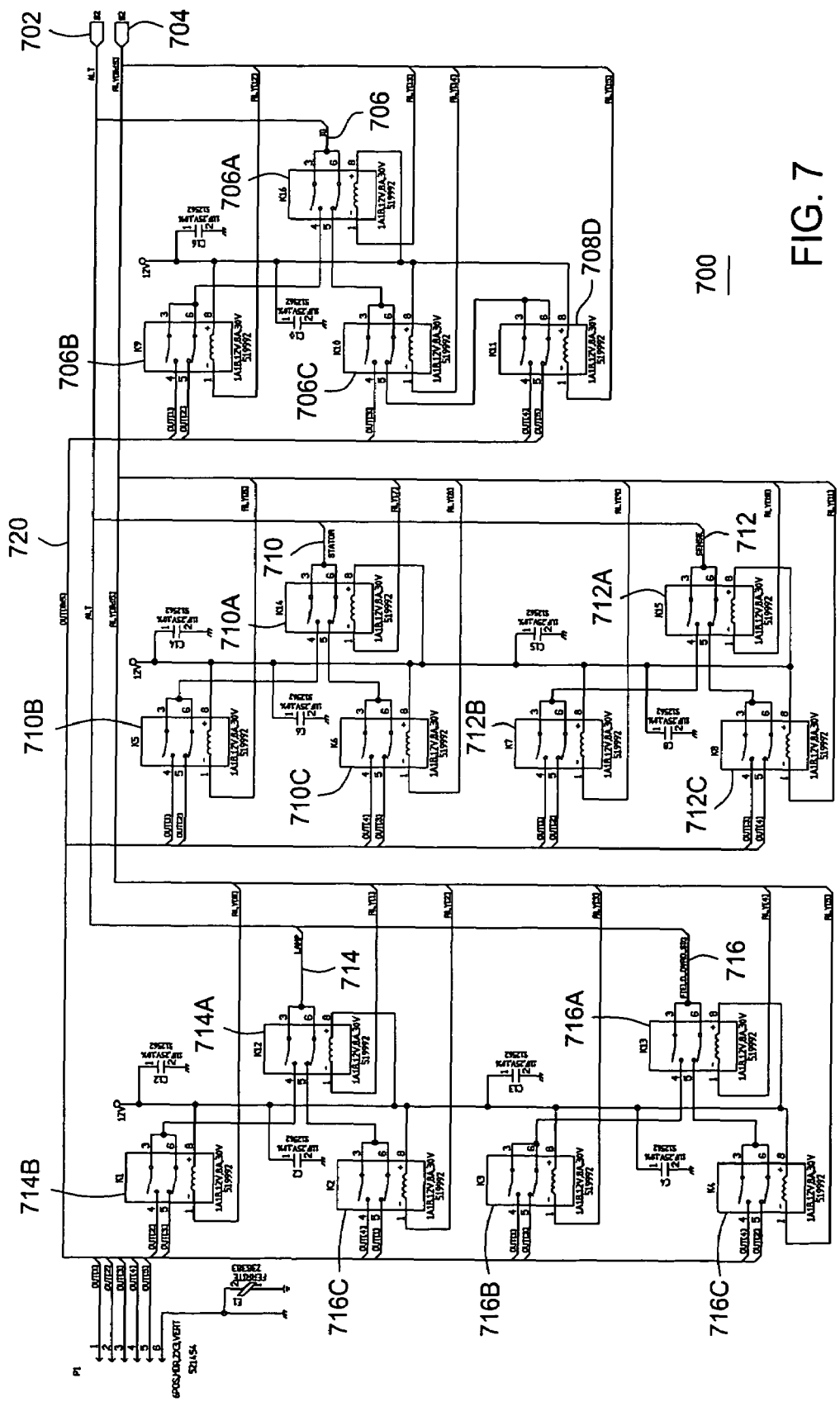
FIG. 7 illustrates an embodiment of the present invention having multiplexing capabilities.

FIG. 7 illustrates an embodiment of the present invention having multiplexing capabilities. Multiplexer 700 generally includes various test components for an alternator system, such as ignition 706, stator 710, sense 712 (battery+signal), lamp 714, and field driver signal 716. A person skilled in the art would recognize that the multiplexer can receive any signal from the component under test as desired by the user. Alternator cable 702 and relay cable 704 can be connected to a printed circuit board in the tester or any other place on the tester as desired. The multiplexing system includes software that controls the various relays and the signal received during testing from the alternator based on the type or model of the alternator. Although described for an alternator, the multiplexer can be used with the starter motor.

The relay cable 704 can control the various switches depending on the desired pin from which the test signal is to be received. Ignition 706 includes four switches 706A, 706B, 706C, and 706D, which allows signals to be received from five pins instead of having three switches that can received signal from four pins. As ignition 706 is shown, the switches 706A, 706B, 706C, and 706D are set so that signals from pin 5 of the connector that is connected to the alternator is being received by the tester. If the ignition signal is on pin 1, then the software will command switch 706A to connect at the top gate (3,4) and disconnect at the bottom gate (5,6) and command switch 706B to connect at the top gate (3,4) and disconnect at the bottom gate (5,6).

Stator 710 includes three switches 710A, 710B, and 710C that allows access to four pins. As stator 710 is shown, the switches 710A, 710B, and 710C are set so that signals from pin 3 of the connector that is connected to the alternator is being received by the tester. Sense 712 includes three switches 712A, 712B, and 712C that allows access to four pins. As sense 712 is shown, the switches 712A, 712B, and 712C are set so that signals from pin 4 of the connector that is connected to the alternator is being received by the tester.

Lamp 714 includes three switches 714A, 714B, and 714C that allows access to four pins. As lamp 714 is shown, the switches 714A, 714B, and 714C are set so that signals from pin 1 of the connector that is connected to the alternator is being received by the tester. Field driver signal 716 includes three switches 716A, 716B, and 716C that allows access to four pins. As field driver signal 716 is shown, the switches 716A, 716B, and 716C are set so that signals from pin 2 of the connector that is connected to the alternator is being received by the tester.

In operation, the user can input the information (type, model number, etc.) regarding the alternator under test through an input device, such as the LCD screen or other input devices and the tests that are to be conducted. Based on the information inputted, the software can configure the multiplexing circuits and so that signals from the right pin will be received by the tester. For example, if the sense signal from the alternator under test will be on pin 1, then the software can instruct, via relay cable 704, for switch 712A to connect top gate (3,4) and disconnect bottom gate (5,6), and for switch 712B to connect top gate (3,4) and disconnect bottom gate (5,6). This will allow signals at pin 1 to be received at the sense 712. The multiplexer 700 can have as many switches as needed and is not limited to the ones shown. For example, there can be 1 to 2 switches or 5 to 8 or more switches.

In other embodiments, the multiplexing software can verify the instruction inputted by the user and performs a series of safety checks before performing any multiplexing actions. For example, some potentially dangerous requests by the user will be declined by the software, such as a request from user to connect B+(sense) directly to the field circuit of an alternator. The software can also protect the tester by probing some voltages on the alternator to detect any fatal problem with the alternator. For example, some signal pins on the alternator may be already shorted to ground. Thus, the software will not perform any multiplexing action in order to avoid shorting the tester circuit to ground.

As stated above, in some embodiments of the alternator and starter tester apparatus, a bar code port is provided. The bar code port may serve to operably connect a bar code reader (not shown) to a microprocessor or controller. In some embodiments, the bar code port may be a conventional component, such as an RS-232 port. The bar code reader may be, for example, a conventional optical bar code reader, such as a gun or wand type reader.

The operator swipes or aims the bar code reader onto a bar code that is associated with the particular starter or alternator to be tested and reads the bar code accordingly. The bar code itself may be affixed to the alternator or starter at the time of manufacture, purchase or service. The bar code may contain information, or point to information stored in a database. Examples of remotely located databases include data based accessible by the Internet, Ethernet, or other remote memory storage facility.

The bar code may provide a variety of information regarding the alternator or starter to be tested. For example, the bar code may provide information regarding the electrical specifications, maintenance information, serial number, lot number, warranty information, and/or a manufacture data code. This data can be used to select parameters for the test cycle run in the alternator and starter tester apparatus. The data provided by the bar code is not limited to the examples given.

In some embodiments, the printer port may print bar code labels that may be attached or otherwise associated with the alternator or starter and provide updated information. The updated information may include, among other things, service dates, service procedures, and warranty information (e.g., time left on warranty, who was the original purchaser, what types of service are and are not warranted, etc.). The printed label may then be read by the bar code reader in subsequent tests cycles. These features can eliminate possible typographical errors during manual input and by speeding up part number selection and entry by having a scanning capability.

The present invention also has the ability to store and display or print technical bulletins associated with specific part numbers of components to be tested. Printouts of test results can give rebuilders access to data obtained by users to assist in the further analysis of that component.

Figure 8:
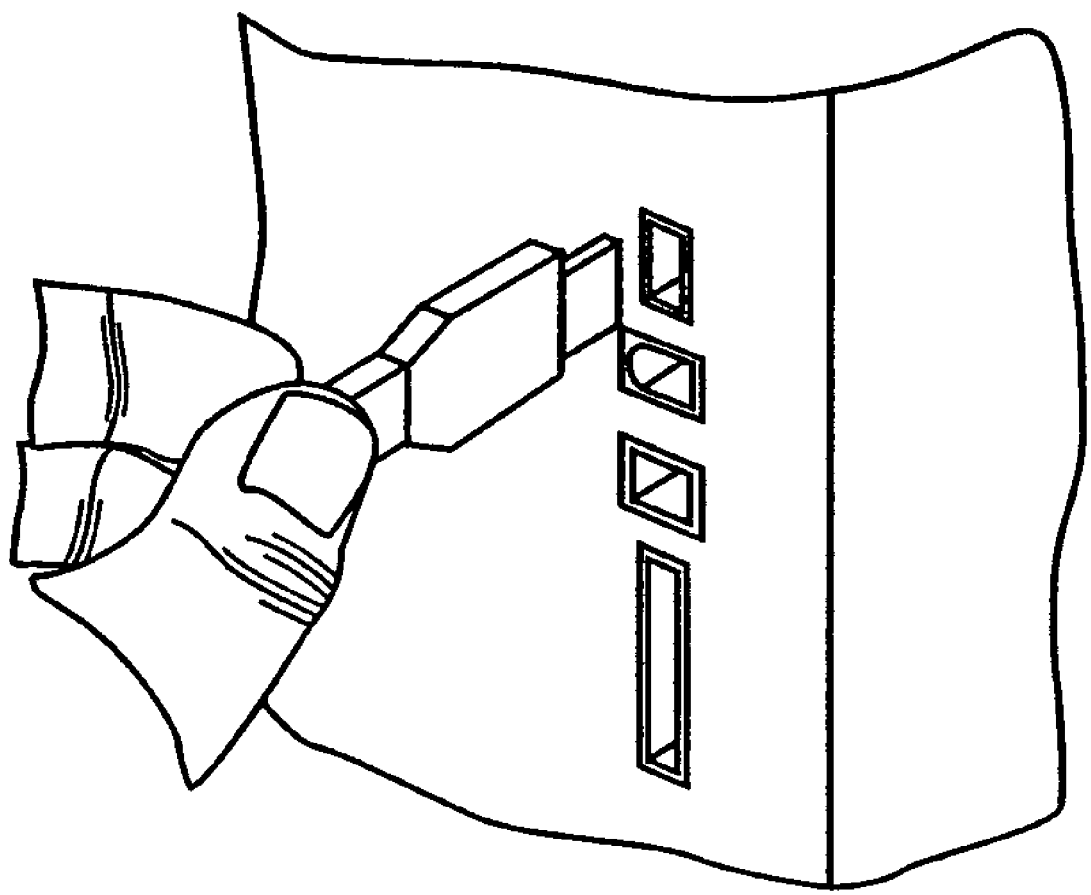
FIG. 8 is a perspective view of the peripheral and remote connections of the testing apparatus.

Referring to FIG. 8, in some embodiments of the alternator and starter tester apparatus, network connectivity may be used to track tests based on part number, employee and location in order to improve and enforce warranty reduction programs. The large scale communication network port can be constructed and arranged to receive an information relay device, such as an Ethernet wired module and/or an Ethernet wireless module. The Ethernet modules communicate at data rates of 10 Mbps (10Base-T Ethernet), 100 Mbps (Fast Ethernet), 1000 Mbps (Gigabit Ethernet) and other data rates. The Ethernet modules can relay information between the alternator and starter tester apparatus and another device connected to the modules via a wire or wirelessly. The information relayed can include data from the result of an alternator and/or starter test, the part's warranty information, the part type, the part make and model, previous tests, updates, diagnostic or operating parameters of the alternator and starter tester apparatus, maintenance data of the alternator and starter tester apparatus, and any other data required by the operator.

Referring to FIG. 8, in some embodiments, peripheral module ports may be used to communicate to various peripheral devices such as a mouse, a keyboard, or a printer as well as to receive updates and/or downloads from a connected device such as a laptop or personal computer. The peripheral module ports may be a USB module having ports for a host connection and a function connection. The USB module may communicate as USB 1.1 or USB 2.0 or other data rates. The host connection may accommodate a mouse, a keyboard, or a printer. The function connection may accommodate a laptop or personal computer.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. An alternator and starter tester for testing a starter motor, comprising:
 a software that controls a starter zero test;
 a first switch, when closed, allows power to a transformer;
 a second switch, when closed, allows power to a solenoid of the starter motor;
 a current meter that measures current flowing on a power line; and
 a processor that communicates with the software, the first switch, the second switch, the transformer, the solenoid and the current meter, wherein the starter motor fails the starter zero test when the first switch is activated to allow power to the transformer and current is detected as flowing.

2. The tester of claim 1, wherein the starter zero test determines if the starter motor fails by monitoring current before the solenoid is energized.

3. The tester of claim 1, wherein the starter zero test determines if the starter motor fails by monitoring current after the solenoid is energized and deenergized.

4. The tester of claim 1, wherein the starter motor fails if current is detected after the first switch is closed and current is supplied to the transformer.

5. The tester of claim 1, wherein the starter motor fails if current is detected after the second switch is closed and the solenoid is energized and deenergized.

6. The tester of claim 4, wherein the starter motor fails if the current is above about 40 amps.

7. The tester of claim 5, wherein the starter motor fails if the current is above about 40 amps.

8. An alternator and starter tester system for testing a starter motor, comprising:
- a software means that controls a starter zero test;
- a first switch means, when closed, allows power to a power transforming means;
- a second switch means, when closed, allows power to a solenoid means of the starter motor;
- a current measuring means that measures current flowing on a power line; and
- a processing means that communicates with the software means, the first switch means, the second switch means, the power transforming means, the solenoid means and the current measuring means, wherein the starter motor fails the starter zero test when the first switch means is activated to allow power to the transformer and current is detected as flowing.

9. The tester system of claim 8, wherein the starter zero test determines if the starter motor fails by monitoring current before the solenoid means is energized.

10. The tester system of claim 8, wherein the starter zero test determines if the starter motor fails by monitoring current after the solenoid means is energized and deenergized.

11. The tester system of claim 8, wherein the starter motor fails if current is detected after the first switch means is closed and current is supplied to the power transforming means.

12. The tester system of claim 8, wherein the starter motor fails if current is detected after the second switch means is closed and the solenoid means is energized and deenergized.

13. The tester system of claim 11, wherein the starter motor fails if current is above about 40 amps.

14. The tester system of claim 12, wherein the starter motor fails if current is above about 40 amps.

15. The tester system of claim 8 further comprising a memory means for storing the software means.

* * * * *